US011088701B1

(12) United States Patent
Paul et al.

(10) Patent No.: US 11,088,701 B1
(45) Date of Patent: Aug. 10, 2021

(54) ANALOGUE TO DIGITAL CONVERTER WITH TOP PLATE SAMPLING ARCHITECTURE FOR LINEAR OPERATION

(71) Applicant: SILICONCH SYSTEMS PVT LTD, Karnataka (IN)

(72) Inventors: Sabu Paul, Karnataka (IN); Rohit Dawar, Karnataka (IN); Nitish Kuttan, Karnataka (IN); Ch Yaswanth Sai Kiran, Andhra Pradesh (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 0 days.

(21) Appl. No.: 17/076,605

(22) Filed: Oct. 21, 2020

(30) Foreign Application Priority Data

Aug. 20, 2020 (IN) .............................. 202041035941

(51) Int. Cl.
| | |
|---|---|
| *H03M 1/12* | (2006.01) |
| *H03M 1/00* | (2006.01) |
| *H03M 1/08* | (2006.01) |
| *H03M 1/18* | (2006.01) |
| *H03M 1/06* | (2006.01) |

(52) U.S. Cl.
CPC ......... *H03M 1/1245* (2013.01); *H03M 1/001* (2013.01); *H03M 1/0607* (2013.01); *H03M 1/0872* (2013.01); *H03M 1/181* (2013.01)

(58) Field of Classification Search
CPC ........................... H03M 1/1245; H03M 1/001
USPC ........................................ 341/155, 172, 122
See application file for complete search history.

(56) References Cited

U.S. PATENT DOCUMENTS

| 9,634,685 B2* | 4/2017 | Francis | ............... H03F 3/45237 |
| 9,806,730 B1* | 10/2017 | Dusad | ..................... H03M 1/08 |

OTHER PUBLICATIONS

Universal Serial Bus Type-C Cable and Connector Specification Release 2.0, USB 3.0 Promoter Group, Aug. 2019 (373 pages).
Universal Serial Bus Power Delivery Specification, Revision 3.0, Version 2.0, Aug. 29, 2019 (657 pages).

* cited by examiner

*Primary Examiner* — Peguy Jean Pierre
(74) *Attorney, Agent, or Firm* — Procopio, Cory, Hargreaves & Savitch LLP

(57) ABSTRACT

The present disclosure provides an analogue to digital converter (ADC) (100), which includes: a capacitive digital to analogue converter (DAC) (120) configured to sample and hold a received sampling input signal and a latched comparator (140) including a first metal oxide semiconductor field effect transistor (MOSFET) (202); a second MOSFET (204) connected in parallel to the first MOSFET; a third MOSFET (226), wherein a third source terminal of the third MOSFET (226) is coupled with first drain terminal and second drain terminal of the first and second MOSFET (202, 204), wherein a sampling switch (130) is configured to the third source terminal to selectively allow voltage to be supplied to the third MOSFET (226), and wherein the sampling switch is configured to disallow voltage to be supplied to the third MOSFET when the ADC is sampling the input signal.

6 Claims, 2 Drawing Sheets

ANALOGUE TO DIGITAL CONVERTER WITH TOP PLATE SAMPLING ARCHITECTURE FOR LINEAR OPERATION

CROSS REFERENCE TO RELATED APPLICATIONS

This Paris Convention Patent application claims benefit under 35 U.S.C. § 119 and claims priority to Indian Patent Application No. IN 202041035941, filed on Aug. 20, 2020, titled "AN ANALOGUE TO DIGITAL CONVERTER WITH TOP PLATE SAMPLING ARCHITECTURE FOR LINEAR OPERATION", the content of which is incorporated herein in its entirety by reference for all purposes.

TECHNICAL FIELD

The present disclosure generally relates to analogue-digital converters. More particularly, the present disclosure relates to a successive approximation analogue-digital converter (SAR ADC) with latch only comparator capable of improving linearity in a top plate sampling configuration.

BACKGROUND

In electronics, an analogue-to-digital converter (ADC, A/D, or A-to-D) is a system that converts an analogue signal, such as a sound picked up by a microphone or light entering a digital camera, into a digital signal. An ADC may also provide an isolated measurement such as an electronic device that converts an input analogue voltage or current to a digital number representing the magnitude of the voltage or current. Typically, the digital output is a two's complement binary number that is proportional to the input, but there are other possibilities.

There are several ADC architectures. Due to the complexity and the need for precisely matched components, all but the most specialized ADCs are implemented as integrated circuits (ICs). These typically take the form of metal-oxide-semiconductor (MOS) mixed-signal integrated circuit chips that integrate both analogue and digital circuits.

A successive approximation ADC is a type of analogue-to-digital converter that converts a continuous analogue waveform into a discrete digital representation via a binary search through all possible quantization levels before finally converging upon a digital output for each conversion.

In the current art, SAR ADC utilize bottom plate sampling for charge redistribution and a track-and-hold circuit is connected to the bottom plate of a given capacitor array. There are a number of limitations and disadvantages associated with this technique and they include, without limitation, the following: (i) the input must be routed to every bottom-plate in the capacitor array; (ii) every capacitor requires a separate sampling switch; (iii) the boosted gate-drive for these switches too must be routed often resulting in an increase on the parasitic capacitor on the sampling network and the bootstrap circuit; and (iv) an extant leakage from all reference switches associated with the sampling network with this leakage causing a degradation of sampling linearity.

Therefore, there is a need in the art to provide a reliable and efficient SAR ADC that can overcome the limitations mentioned above in addition to providing a robust ADC.

OBJECTS OF THE INVENTION

It is an object of the present invention to provide a top plate sampling architecture for a successive approximation analogue-digital converter.

It is another object of the present invention to provide a simple and cost effective top plate sampling architecture for a successive approximation analogue-digital converter.

It is another object of the present invention to provide a reliable and efficient top plate sampling architecture for a successive approximation analogue-digital converter.

It is another object of the present invention to provide a robust top plate sampling architecture for a successive approximation analogue-digital converter.

SUMMARY

In an aspect, the present disclosure provides an analogue to digital converter (ADC), which includes: a capacitive digital to analogue converter (DAC) configured to sample and hold a received sampling input signal, the sampling being configured on a top plate associated with the capacitive DAC; and a latched comparator coupled with the capacitive DAC and configured to receive the sampled input signal. The latched comparator includes: a first metal oxide semiconductor field effect transistor (MOSFET) having a first source terminal and a first drain terminal; a second MOSFET connected in parallel to the first MOSFET, the second MOSFET having a second source terminal and a second drain terminal; a third MOSFET having a third source terminal and a third drain terminal, the third source terminal coupled with the first drain terminal and the second drain terminal, wherein a sampling switch is configured to the third source terminal to selectively allow voltage to be supplied to the third MOSFET, and wherein the sampling switch is configured to disallow voltage to be supplied to the third MOSFET when the ADC is sampling the input signal.

In an embodiment, the ADC can include a plurality of reference switches configured to hold a bottom plate associated with the capacitive DAC to a predefined common-mode during sampling.

In another embodiment, the plurality of reference switches can be configured to force the bottom plate to achieve a hold-phase common-mode on the top-plate during ADC conversion.

In another embodiment, the plurality of reference switches can be configured to create offsets in the sampling path to convert signals capable of swing around different centre voltages.

In another embodiment, the first MOSFET and the second MOSFET can be connected in a feedback inverter arrangement.

Various objects, features, aspects, and advantages of the inventive subject matter will become more apparent from the following detailed description of preferred embodiments, along with the accompanying drawing figures in which like numerals represent like components

BRIEF DESCRIPTION OF THE DRAWINGS

The accompanying drawings are included to provide a further understanding of the present invention and are incorporated in and constitute a part of this specification. The drawings illustrate exemplary embodiments of the present invention and, together with the description, serve to explain the principles of the present invention.

DETAILED DESCRIPTION

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Figure 1:
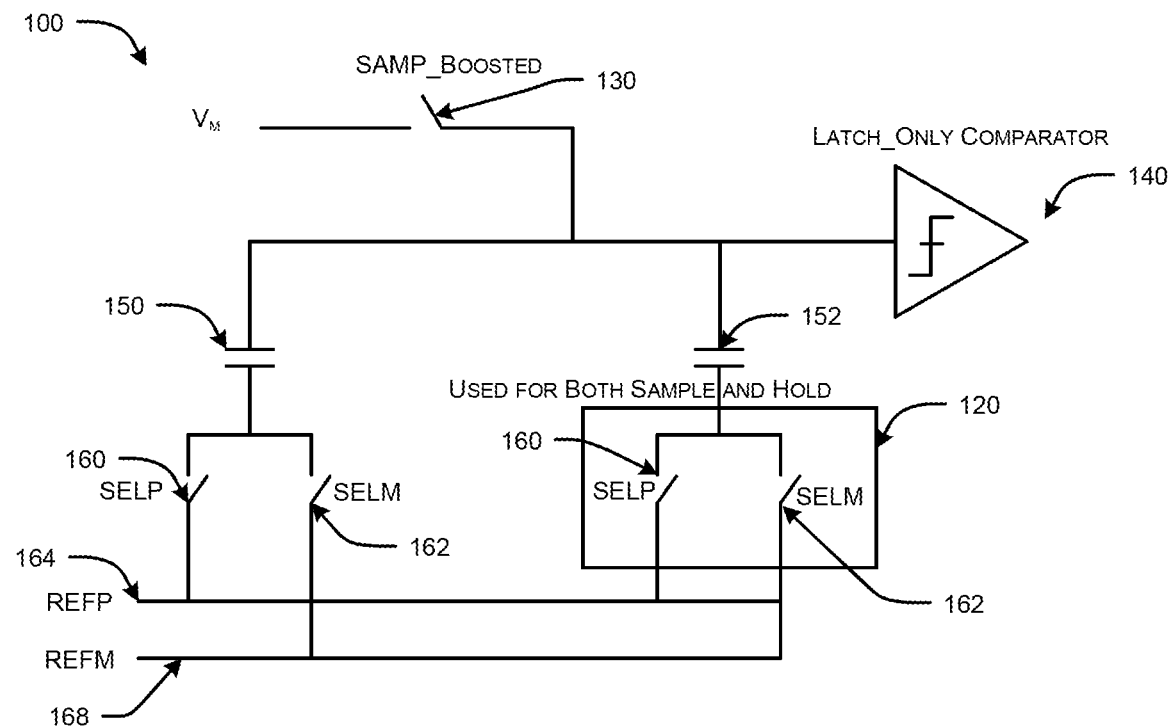
FIG. 1 illustrates an exemplary top plate sampling architecture of a successive approximation analogue to digital converter (100), in accordance with an embodiment of the present disclosure.

FIG. 1 illustrates an exemplary top plate sampling architecture of a successive approximation analogue to digital converter (SAR ADC) (100), in accordance with an embodiment of the present disclosure. The SAR ADC (100) can include a capacitive DAC (120), a latched comparator 140 and a sampling switch (130). The bottom plates of the capacitors in the DAC for instance (150) and (152) are driven by the voltages REFP (164) and REFM (168) using the switches SELP (160) and SELM (162) respectively. The switches (160 and 162) are configured to hold the bottom plates (150) and (152) in a common-mode during sampling. The sampling switch (130) can sample the analog input Vm on the top plate of the capacitive DAC (120). The sampling switch (130) can be configured to allow source voltage in an on-position and pause source voltage in an off-position. In an embodiment, the on-position typically can correspond to when the SAR ADC (100) is in a triggered position or during sampling stage while the off-position can correspond to the when the SAR ADC (100) is in a non-triggered position or during a stage when there is no sampling. The output of the latched comparator (140) can be further used to control the flow of the switching logic for the bottom plate switches.

Figure 2:
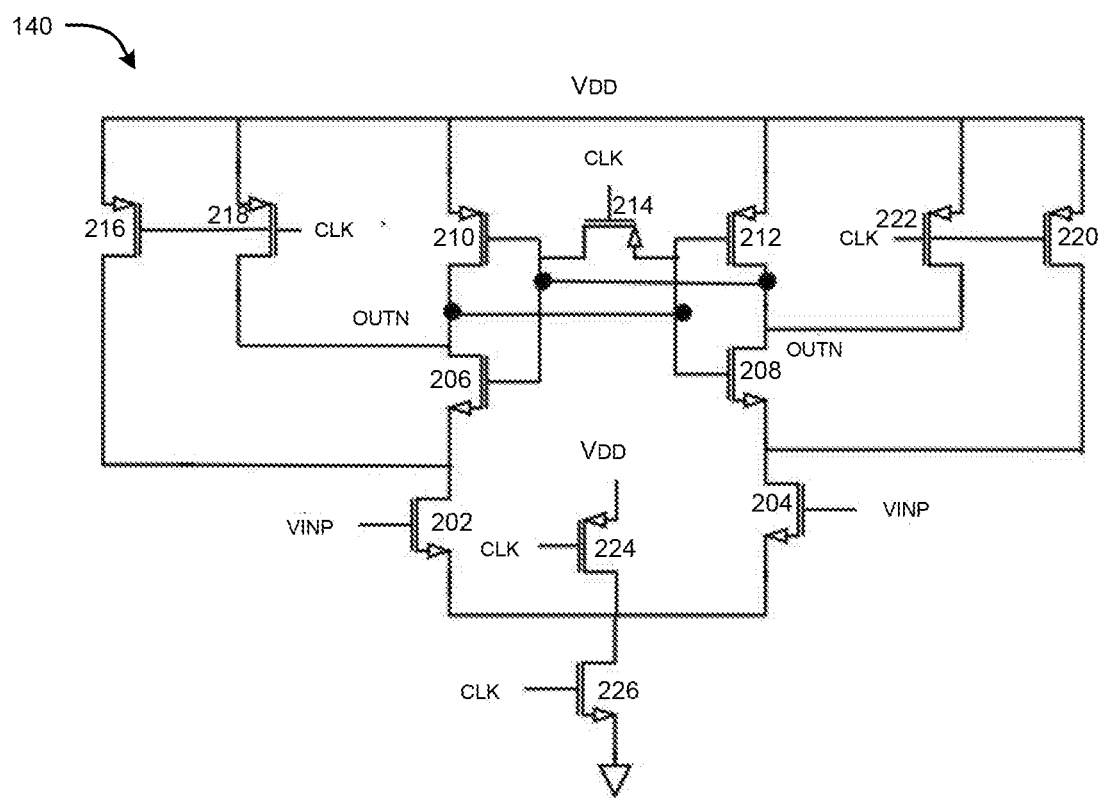
FIG. 2 illustrates an exemplary circuit of a latched comparator (140) associated with the top plate sampling architecture of a successive approximation analogue to digital converter, in accordance with an embodiment of the present disclosure.

The capacitive DAC (120) can be configured to sample and hold a sampling input signal with the sampling being configured on a top plate (not shown) associated with the capacitive DAC (120). FIG. 2 illustrates an exemplary circuit of a latched comparator (140) associated with the top plate sampling architecture of a successive approximation analogue to digital converter (i.e. 100), in accordance with an embodiment of the present disclosure. The circuitry of the latched comparator (140), as shown in FIG. 2, can include a first metal oxide semiconductor field effect transistor MOSFET (202), a second MOSFET (204) and a third MOSFET (226). The first MOSFET (202) can have a first source terminal and a first drain terminal and the second MOSFET (204) which is typically connected in parallel to the first MOSFET (202) can have a second source terminal and a second drain terminal. The third MOSFET (226) can have a third source terminal and a third drain terminal. The circuitry of the latched comparator (140) can also include other MOSFETs (204), (206), (208), (210), (212), (214), (216), (218), (220), (222) and (224). The first MOSFET (202) and the second MOSFET (204) along with the other MOSFET (206) form a differential pair. The decision is taken on the positive edge of the clk signal. The MOSFETs (206) and (208) along with the MOSFETs (210) and (212) can form a cross coupled inverter to latch the decision. The MOSFETs (214), (216), (218), (220), (222) and (224) are used to pull up all the internal nodes they are connected, to the supply voltage.

Referring to FIG. 2, the third source terminal of the third MOSFET (226) can be connected to the first drain terminal of the first MOSFET (202) while the third source terminal of the third MOSFET (226) can be connected to the second drain terminal of the second MOSFET (204). The third source terminal of the third MOSFET (226) is further connected to a positive voltage supply configured to provide supply voltage by means of a switch. As can be appreciated by those skilled in the art, the connections are all electrical. The plurality of reference switches (162, 164) can further be configured to force the bottom plate to achieve a hold-phase common-mode on the top-plate during ADC conversion. The plurality of reference switches can also be further configured to create offsets in the sampling path to convert signals capable of swing around different centre voltages.

The configuration of ADC (100) as described in FIGS. 1 and 2, lead to several advantages over the conventional technologies which involve bottom plate sampling including, but not limited to the aspects provided. Firstly, the ADC convertor of the present disclosure avoids the need for routing input to every bottom plate in a cap-array and also does not need a separate sampling switch for each cap. Further, the configuration of ADC in the present disclosure addresses the problem regarding leakage at reference switches in the conventional bottom plate sampling, wherein the leakage can be a non-linear function of the input flowing through the impedance of the sampling network thus seriously degrading sampling linearity. Further, top plate sampling as done by ADC (100) requires only a single sampling switch and no other switches are needed on the top plate, while ensuring routing of input and boosted gate-drive is minimal.

Figure 3:
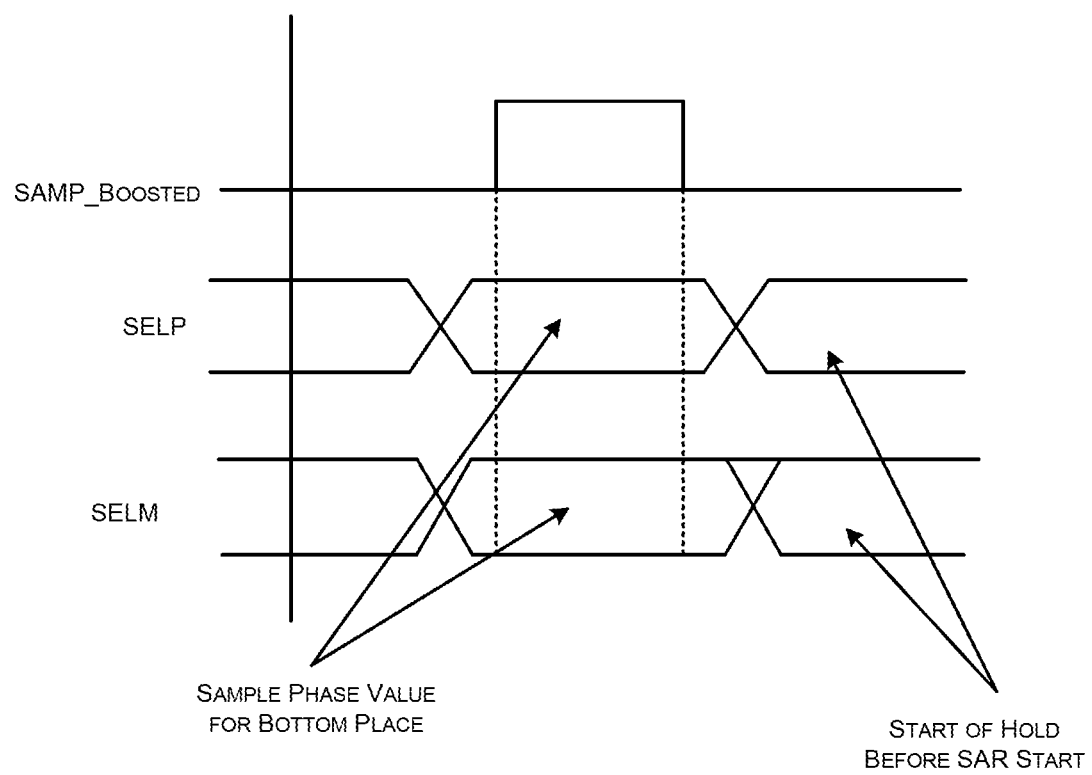
FIG. 3 illustrates a timing diagram based on the top plate sampling architecture of a successive approximation analogue to digital converter (100), in accordance with an embodiment of the present disclosure.

FIG. 3 illustrates a timing diagram based on the top plate sampling architecture of a successive approximation analogue to digital converter (i.e. 100), in accordance with an embodiment of the present disclosure. As can be seen, a linearity is achieved with the instant SAR ADC 100 with a single sampling switch being used. This ADC uses a single-ended DAC and sampling network. In case of conventional bottom-plate sampling, a strong buffer may be required to drive top-plate to correct common-mode during sampling-phase. However, the present disclosure addresses the problem by moving the sampling switch to the top-plate and reusing the reference switches to drive the bottom-plates to the correct bottom-plate common mode during sampling, thus the need for the buffer can be eliminated. Further, non-linear capacitor load presented by the comparator on the sampling node may result in the degrading of sampling linearity. Since the source of the non-linear cap is the gate-channel capacitance of the input pair, a turn off position (see off-position associated with the sampling switch above) of the channel may be implemented by forcing the source node of the input-pair to supply. This can remove the non-linear capacitor from the comparator completely, wherein only the overlap capacitors remain, and these are linear enough for the application. Furthermore, the bottom place can be driven to REFM (FIG. 1) by the reference switches itself during sampling phase. No extra switches are used for sampling. Therefore, by moving to this implementation of top-plate sampling from the conventional bottom-plate sampling, the total number of switches used has been reduced.

Thus, some limitations that the present disclosure overcomes include: (i) the sampling linearity/reference; (ii) Switch leakage; (iii) Routing complexity; (iv) Need for a strong VCM buffer in bottom-plate sampling; (v) Reduced load on boot-strapping circuit; (vi) Reduced charge-injection during sampling.

In an aspect, a 1 pF sampling capacitor can be utilized. In an aspect, a 750 nm/130 nm sampling switch can be utilized. In an aspect, 100f Comparator load can be utilized. In an aspect, Sampling Linearity −75 dBFS+ across PVT can be utilized.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present invention provides a top plate sampling architecture for a successive approximation analogue-digital converter.

The present invention provides a simple and cost effective top plate sampling architecture for a successive approximation analogue-digital converter.

The present invention provides a reliable and efficient top plate sampling architecture for a successive approximation analogue-digital converter.

The present invention provides a robust top plate sampling architecture for a successive approximation analogue-digital converter.

We claim:

1. An analogue to digital converter (ADC) comprising:
 a capacitive digital to analogue converter (DAC) configured to sample and hold a received sampling input signal, the sampling being configured on a top plate associated with the capacitive DAC; and
 a latched comparator coupled with the capacitive DAC and configured to receive the sampled input signal, said latched comparator comprising:
  a first metal oxide semiconductor field effect transistor (MOSFET) having a first source terminal and a first drain terminal;
  a second MOSFET connected in parallel to the first MOSFET, the second MOSFET having a second source terminal and a second drain terminal;
  a third MOSFET having a third source terminal and a third drain terminal, the third source terminal coupled with the first drain terminal and the second drain terminal; and
 wherein a sampling switch is configured to the third source terminal to selectively allow voltage to be supplied to the third MOSFET, and
 wherein the sampling switch is configured to disallow voltage to be supplied to the third MOSFET when the ADC is sampling the input signal.

2. The ADC as claimed in claim 1, wherein the ADC comprises a plurality of reference switches configured to hold a bottom plate associated with the capacitive DAC to a predefined common-mode during sampling.

3. The ADC as claimed in claim 2, wherein the plurality of reference switches are configured to force the bottom plate to achieve a hold-phase common-mode on the top-plate during ADC conversion.

4. The ADC as claimed in claim 2, wherein the plurality of reference switches are configured to create offsets in the sampling path to convert signals capable of swing around different centre voltages.

5. The ADC as claimed in claim 1, wherein the first MOSFET and the second MOSFET are connected in a feedback inverter arrangement.

6. The ADC as claimed in claim 1, wherein the MOSFETS are transistors.

* * * * *